United States Patent
Fette

(10) Patent No.: US 6,714,085 B1
(45) Date of Patent: Mar. 30, 2004

(54) PREPOSITIONED FREQUENCY SYNTHESIZER AND METHOD THEREFOR

(75) Inventor: Bruce Alan Fette, Mesa, AZ (US)

(73) Assignee: General Dynamics Decision Systems, Inc, Scottsdale, AZ (US)

( * ) Notice: Subject to any disclaimer, the term of this patent is extended or adjusted under 35 U.S.C. 154(b) by 0 days.

(21) Appl. No.: 10/280,541

(22) Filed: Oct. 24, 2002

(51) Int. Cl.[7] .............................. H03L 7/093; H03L 7/18
(52) U.S. Cl. ............................ 331/17; 331/16; 331/18; 331/1 A
(58) Field of Search ............................ 331/1 A, 16, 17, 331/18, 25; 327/156–159; 332/127; 360/51; 375/376; 455/260

(56) References Cited

U.S. PATENT DOCUMENTS

| | | |
|---|---|---|
| 4,410,860 A | 10/1983 | Kipp |
| 4,562,410 A | 12/1985 | O'Rourke |
| 4,760,586 A | 7/1988 | Takeda |
| 4,980,652 A * | 12/1990 | Tarusawa et al. ............ 331/1 A |
| 5,036,295 A | 7/1991 | Kamitani |
| 5,045,818 A | 9/1991 | Miura |
| 5,113,152 A | 5/1992 | Norimatsu |
| 5,355,098 A | 10/1994 | Iwasaki |
| 5,389,899 A | 2/1995 | Yahagi |
| 5,477,194 A | 12/1995 | Nagakura |
| 5,497,126 A | 3/1996 | Kosiec |
| 5,552,727 A | 9/1996 | Nakao |
| 5,656,975 A | 8/1997 | Imura |
| 5,892,409 A | 4/1999 | Boerstler |
| 5,909,148 A | 6/1999 | Tanaka |
| 6,018,556 A | 1/2000 | Janesch |
| 6,150,887 A | 11/2000 | Yamaguchi |
| 6,396,890 B1 | 5/2002 | Turner |

* cited by examiner

*Primary Examiner*—David Mis
(74) *Attorney, Agent, or Firm*—Lowell W. Gresham; Jordan M. Meschkow; Meschkow & Gresham, PLC

(57) ABSTRACT

A PLL-type frequency synthesizer (10) in which a loop filter (24) state is recorded during an earlier hop to a given frequency then assigned back to the loop filter (24) during a subsequent hop to the same frequency is disclosed. The state is recorded through an A/D converter (48) and assigned through a D/A converter (60). Offset and linearity error is compensated in a compensation circuit (54) so that the state subsequently assigned to the loop filter (24) accurately matches the state that was previously measured for recording. Reference frequency and output signal dividers (16, 40) are both immediately initialized at a hop boundary (82) so that the signals compared by a phase comparator (20) are forced into a phase-matched condition.

21 Claims, 3 Drawing Sheets

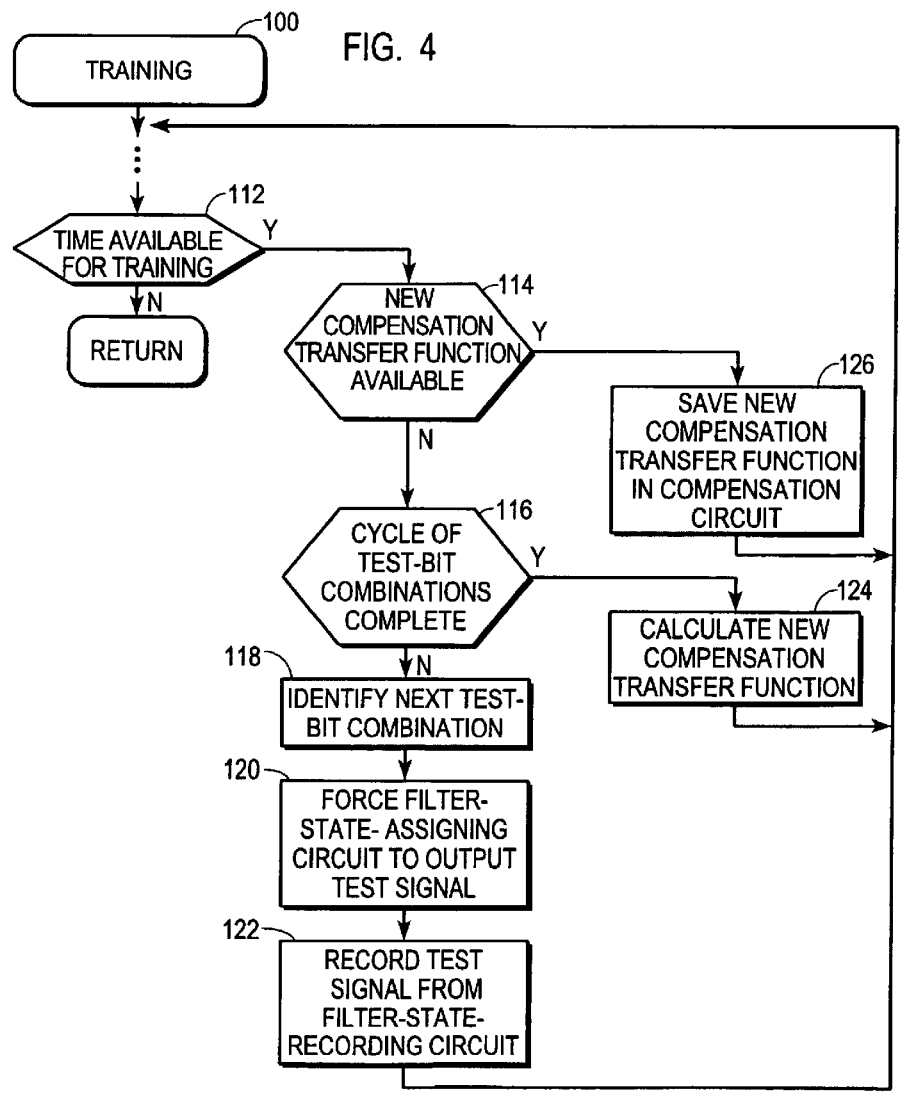

PREPOSITIONED FREQUENCY SYNTHESIZER AND METHOD THEREFOR

TECHNICAL FIELD OF THE INVENTION

The present invention relates generally to the field of frequency synthesizers. More specifically, the present invention relates to frequency synthesizers which incorporate a phase-locked loop to generate an output frequency and which are prepositioned so as to quickly settle at new frequencies while experiencing low phase noise.

BACKGROUND OF THE INVENTION

In frequency hopping radios and other applications a need exists for synthesizing a variety of frequencies with low phase noise and with the ability to quickly settle at new frequencies. A direct synthesis technique uses algebraic manipulation of one or more reference frequencies to produce output frequencies. While direct synthesis may be configured to exhibit quick settling and low phase noise, it unfortunately suffers from a limited bandwidth and often requires complex and expensive filtering.

A more common approach to the frequency synthesizing needs of frequency hopping radios and other applications employs an indirect technique relying on a programmable phase-locked loop (PLL) to control a voltage controlled oscillator (VCO) that produces desired-output frequencies. A conventional, non-prepositioned PLL-type frequency synthesizer includes a phase comparator, loop filter, VCO, and frequency divider all arranged in a loop, and a reference frequency source. The frequency divider is programmed to achieve a desired output frequency at the VCO. The phase comparator compares phases of a reference frequency and a divided output frequency. The loop filter responds to the phase comparator and drives the VCO to alter its output frequency in a manner that reduces phase differences at the phase comparator. This indirect, non-prepositioned technique can provide a low cost, wide bandwidth synthesizer. Unfortunately, it achieves low phase noise using a narrow bandwidth loop filter that causes slow settling to new frequencies, or achieves quick settling to new frequencies using a wide bandwidth loop filter that causes high phase noise.

Accordingly, conventional PLL-type frequency synthesizers have devised prepositioning techniques that seek to establish certain initial conditions in the PLL when switching to new frequencies. In other words, indirect, prepositioned frequency synthesizers "preposition" a PLL, which typically has a narrow bandwidth loop filter, to an initial condition from which the PLL need not search very far in order to achieve a condition where the output frequency is locked to a reference frequency. Since the PLL need not search far to achieve lock, it settles at new output frequencies more quickly than a non-prepositioned PLL-type frequency synthesizer having about the same loop-filter bandwidth.

In one form of conventional prepositioning, the voltage stored on a loop-filter capacitor is prepositioned to approximately that voltage expected when the desired output frequency is generated. The more accurate forms record the capacitor voltage during an earlier period when a given output frequency has been generated, then attempt to set the capacitor voltage to that same value at the beginning of a later period when the same frequency is to be generated again. But capacitor voltage is a sensitive parameter where small errors can lead to large output frequency offsets. Even the more accurate forms of this type of prepositioning fail to accurately set the capacitor to the correct voltage; the PLL's are then forced to expend precious time searching for desired output frequencies; and, settling time suffers.

In another form of conventional prepositioning, the frequency divider is prepositioned to an initial condition where the divided output frequency is phase matched, at least at a given instant, with the reference frequency. This type of prepositioning prevents a phase rollover phenomenon that can be responsible for a PLL experiencing a very long lock time. Phase rollover occurs when the phase of the divided output frequency is nearly 180° out-of-phase with the reference frequency even though the frequencies may be nearly equal.

Unfortunately, the conventional approach to this type of prepositioning inserts delay into the frequency-switching process by waiting to reset a frequency divider counter until a predetermined edge of the reference signal is detected, and the delay slows the settling time. Moreover, the occurrence of the predetermined edge of the reference signal is often a time-uncertain event because the reference signal is not synchronized with the circuitry that resets the frequency divider. Accordingly, settling times can only be guaranteed for the worst case delay that might occur while waiting for the predetermined edge of the reference signal.

What is needed is a prepositioned frequency synthesizer that improves upon conventional prepositioning techniques so that faster settling times may be achieved for a given loop filter bandwidth.

SUMMARY OF THE INVENTION

It is an advantage of the present invention that an improved prepositioned frequency synthesizer and method are provided.

Another advantage of the present invention is that frequency synthesizer prepositioning techniques are improved upon to achieve faster settling times for a given loop filter bandwidth.

Another advantage of the present invention, at least in one embodiment thereof, is that a compensation circuit is provided to accurately preposition the state of a loop filter so that errors are reduced and the PLL need not search as far to settle at a desired frequency.

Another advantage of the present invention, at least in one embodiment thereof, is that frequency dividers are provided for both a reference frequency and the output frequency so that, among other reasons, both frequency dividers can be instantly set to an initial value where the signals compared in a phase comparator are nearly equal.

These and other advantages are realized in one form by an improved prepositioned frequency synthesizer for rapidly settling at new frequencies. The prepositioned synthesizer includes a first frequency divider configured to divide a frequency of a synthesizer-output signal by a number N. A second frequency divider is configured to divide a frequency of a reference signal by a number M. A phase comparator has inputs coupled to the first and second frequency dividers, and a loop filter couples to the phase comparator. A variable frequency oscillator has an input coupled to the loop filter and an output configured to provide the synthesizer-output signal. A filter-state-recording circuit couples to the loop filter and is configured to record states exhibited by the loop filter. A filter-state-assigning circuit couples to the loop filter and is configured to assign states to the loop filter. In addition, a controller couples to the first and second dividers and to the filter-state-assigning circuit. The controller is configured to set the first and second frequency dividers to initial conditions and to assign a state to the loop filter when changing to a new frequency.

These and other advantages are realized in another form by an improved prepositioned frequency synthesizer for rapidly settling at new frequencies. The prepositioned synthesizer includes a reference frequency source and a frequency divider configured to divide a frequency of a synthesizer-output signal by a number N. A phase comparator has a first input coupled to the frequency divider and a second input coupled to the reference frequency source. A loop filter couples to the phase comparator, and a variable frequency oscillator has an input coupled to the loop filter and an output configured to provide the synthesizer-output signal. A filter-state-recording circuit couples to the loop filter and is configured to record states exhibited by the loop filter. A filter-state-assigning circuit couples to the loop filter and is configured to assign states to the loop filter. In addition, a compensation circuit couples to the filter-state-recording circuit and to the filter-state-assigning circuit. The compensation circuit is configured to compensate for response differences between the filter-state-recording circuit and the filter-state-assigning circuit.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, and:

FIG. 3 shows an exemplary table maintained in a controller of the prepositioned frequency synthesizer of FIG. 1 to define a frequency hopping plan; and FIG. 4 shows a flow chart of a training sub-process carried out by the controller of the prepositioned frequency synthesizer of FIG. 1.

DETAILED DESCRIPTION OF THE PREFERRED EMBODIMENTS

Figure 1:
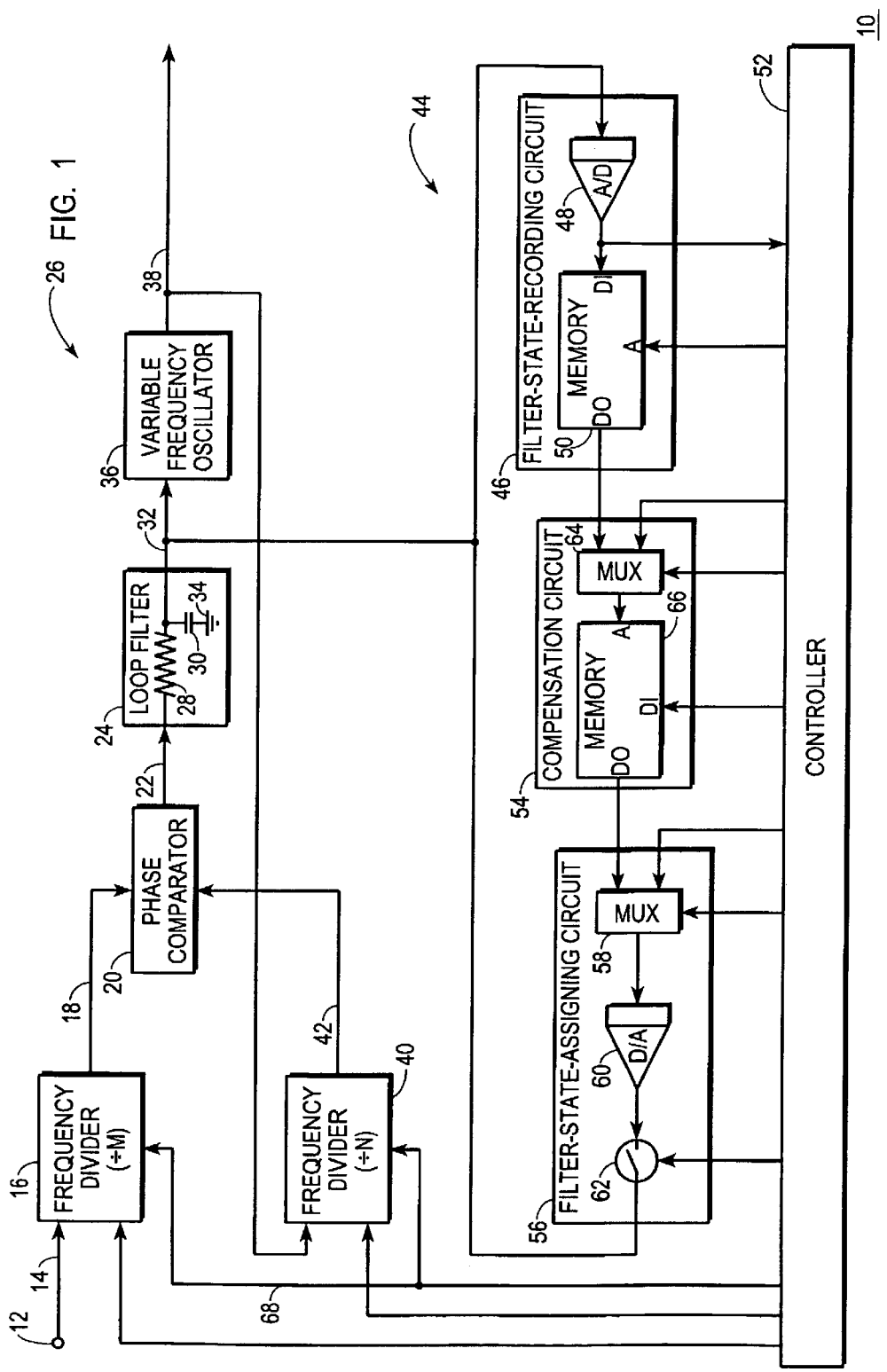
FIG. 1 shows a block diagram of a preferred embodiment of a prepositioned frequency synthesizer configured in accordance with the teaching of the present invention.

FIG. 1 shows a block diagram of a preferred embodiment of a prepositioned frequency synthesizer 10 configured in accordance with the teaching of the present invention. Synthesizer 10 includes a reference frequency signal source 12 from which a reference signal 14 oscillating at a reference frequency is supplied. Reference frequency signal source 12 couples to a reference frequency divider 16. Frequency divider 16 is configured to produce a divided reference signal 18 oscillating at the reference frequency divided by M, where M is usually viewed as an integer number. Divided reference signal 18 couples to a first input of a phase comparator 20. An output of phase comparator 20 provides a phase-error signal 22 and couples to an input of a loop filter 24.

Loop filter 24 is configured to influence the bandwidth of a phase-locked loop (PLL) 26 which serves as the basis for synthesizer 10. The specific topology of loop filter 24 is not a critical feature of the present invention, and a variety of loop-filter topologies known in the PLL arts may be used. A loop-filter resistor 28 coupled in series with a loop-filter capacitor 30 represent a typical loop-filter configuration. Phase-error signal 22 typically drives loop-filter resistor 28, a control signal 32 is provided at a junction between loop-filter resistor 28 and loop-filter capacitor 30, and loop-filter capacitor 30 couples between loop-filter resistor 28 and a node 34 configured to provide a common potential, such as ground.

In the preferred embodiment, values for loop-filter resistor 28 and loop-filter capacitor 30 are chosen so that a relatively narrow loop bandwidth for synthesizer 10 results. The narrow loop bandwidth permits synthesizer 10 to be characterized by low phase noise, as is often required in frequency hopping radio and other applications. But a precise characterization of the loop bandwidth and corresponding phase noise is not important to the present invention because the prepositioning techniques of the present invention apply regardless of these parameters.

Control signal 32 drives an input of a variable frequency oscillator 36, configured as a voltage controlled oscillator (VCO) in the preferred embodiment. An output of variable frequency oscillator 36 provides a synthesizer-output signal 38 which serves as the output from prepositioned frequency synthesizer 10. Synthesizer-output signal 38 drives an input of an output-signal frequency divider 40. Frequency divider 40 is configured to divide the frequency of synthesizer-output signal 38 by N, where N is usually viewed as an integer number, producing a divided synthesizer-output signal 42. An output of frequency divider 40 supplies divided synthesizer-output signal 42 to a second input of phase comparator 20.

Control signal 32 also drives, and at times is driven by, a prepositioning circuit 44. Prepositioning circuit 44 causes synthesizer 10 to change or hop to new frequencies and to rapidly settle at these new frequencies once a change has been initiated even when loop filter 24 is configured so that PLL 26 has a relatively narrow bandwidth.

Specifically, control signal 32 is routed to an input of a filter-state-recording circuit 46. Filter-state-recording circuit 46 measures and records the various states exhibited by loop filter 24 as synthesizer 10 hops from frequency to frequency. In the preferred embodiment, the states of loop filter 24 are characterized by voltages stored on loop-filter capacitor 30.

Filter-state-recording circuit 46 includes an analog-to-digital (A/D) conversion circuit 48 having an output coupled to a data input of a read/write memory 50, one example of which is provided by a conventional random access memory (RAM). The output of A/D conversion circuit 48 also couples to an input of a controller 52, and an output of controller 52 couples to an address input of memory 50. A data output of memory 50 serves as the output for filter-state-recording circuit 46 and couples to an input of a compensation circuit 54.

Compensation circuit 54 has an output coupled to an input of a filter-state-assigning circuit 56, and filter-state-assigning circuit 56 has an output that drives control signal 32 from time to time. During these driving times, filter-state-assigning circuit 56 assigns states to loop filter 24, which in the preferred embodiment causes loop-filter capacitor 30 to charge or discharge to desired voltage levels.

Filter-state-assigning circuit 56 includes a multiplexer (MUX) 58. The compensation circuit output couples to a first data input of multiplexer 58. Outputs from controller 52 couple to a second data input of multiplexer 58 and a selection input of multiplexer 58. An output of multiplexer 58 couples to an input of a digital-to-analog (D/A) conversion circuit 60, and an output of D/A conversion circuit 60 couples to a first port of a switching device 62. A second port of switching device 62 couples to loop filter 24, variable frequency oscillator 36, and filter-state-recording circuit 46. A selection input of switching device 62 couples to an output from controller 52.

In the preferred embodiment, A/D conversion circuit 48 and D/A conversion circuit 60 have the same resolution, typically in the range of 8–16 bits. Compensation circuit 54 compensates for response differences between filter-state-recording circuit 46 and filter-state-assigning circuit 56. The response differences are due, at least in part, to offset differences and linearity differences between A/D conversion circuit 48 and D/A conversion circuit 60.

Prepositioning circuit 44 seeks to record a given state of loop filter 24 during an earlier hop period in which a given synthesizer-output frequency is generated. Then, during a later hop period occurring the next time that same synthesizer-output frequency is to be generated, prepositioning circuit 44 seeks to quickly assign that same state to loop filter 24. But due, at least in part, to the response differences between filter-state-recording circuit 46 and filter-state-assigning circuit 56 some error is inevitably introduced while recording the state during the earlier hop period, and additional error is introduced in reproducing the recorded state for assignment to loop filter 24 during the later hop period. Thus, compensation circuit 54 is provided to compensate for these errors.

In addition, compensation circuit 54 adapts to the individual characteristics of filter-state-recording circuit 46 and filter-state-assigning circuit 56. These individual characteristics may differ from synthesizer 10 to synthesizer 10, and may differ within any given synthesizer 10 over time due to temperature changes and component aging. The adaptation is accomplished through a training sub-process, discussed below in connection with FIG. 4. In the preferred embodiment, controller 52 trains compensation circuit 54 when synthesizer 10 is initially energized and on additional occasions while synthesizer 10 remains energized.

In one embodiment, compensation circuit 54 includes a multiplexer (MUX) 64. The filter-state-recording circuit 46 output couples to a first data input of multiplexer 64, and outputs from controller 52 couple to a second data input of multiplexer 64 and a selection input of multiplexer 64. An output of multiplexer 64 couples to an address input of a read/write memory 66, a data input of memory 66 couples to an output of controller 52, and a data output of memory 66 provides the output from compensation circuit 54. Frequency dividers 16 and 40 may be provided by counter circuits in a manner well known in the art. Outputs of controller 52 desirably couple to various inputs of frequency dividers 16. For example, controller 52 desirably drives data inputs of frequency dividers 16 and 40 in a manner that allows controller 52 to instantiate the numbers "M" and "N" by which frequency dividers 16 and 40 respectively divide. By controlling the numbers "M" and "N" in accordance with knowledge about the frequency of reference signal 14, controller 52 programs and controls the frequency of synthesizer-output signal 38 in a substantially conventional manner.

In addition, an output of controller 52 desirably provides a phase-matching signal 68 that drives preset and/or reset inputs of frequency dividers 16 and 40. Controller 52 sets both of frequency dividers 16 and 40 to a predetermined initial condition when changing synthesizer 10 to a new frequency by temporarily activating phase-matching signal 68. Desirably, the initial condition is one in which divided reference signal 18 and divided synthesizer-output signal 42 are viewed by phase comparator 20 as being substantially equal. Moreover, controller 52 and frequency dividers 16 and 40 are desirably configured so that this initial condition may be nearly instantly achieved after activation of phase-matching signal 68. Near-instant achievement of the initial conditions may be achieved by using counter circuits with asynchronous reset or preset inputs, or by clocking such circuits using clock signals having a greater frequency than the signals being divided. Near-instant achievement of the initial condition avoids imposition of a significant delay waiting for a synchronizing edge of either divided reference signal 18 or divided synthesizer-output signal 42.

Controller 52 may be implemented using conventional microprocessor, microcontroller, memory, timer, and like circuits managed by one or more computer programs to carry out various controlling processes, all well known to those skilled in the art. Likewise, controller 52 may employ various latching and counting circuits configured so that multiple events may be set up in advance under the control of a computer program, then clocked or otherwise synchronized to occur substantially simultaneously or at precisely specified instants in time.

Figure 2:
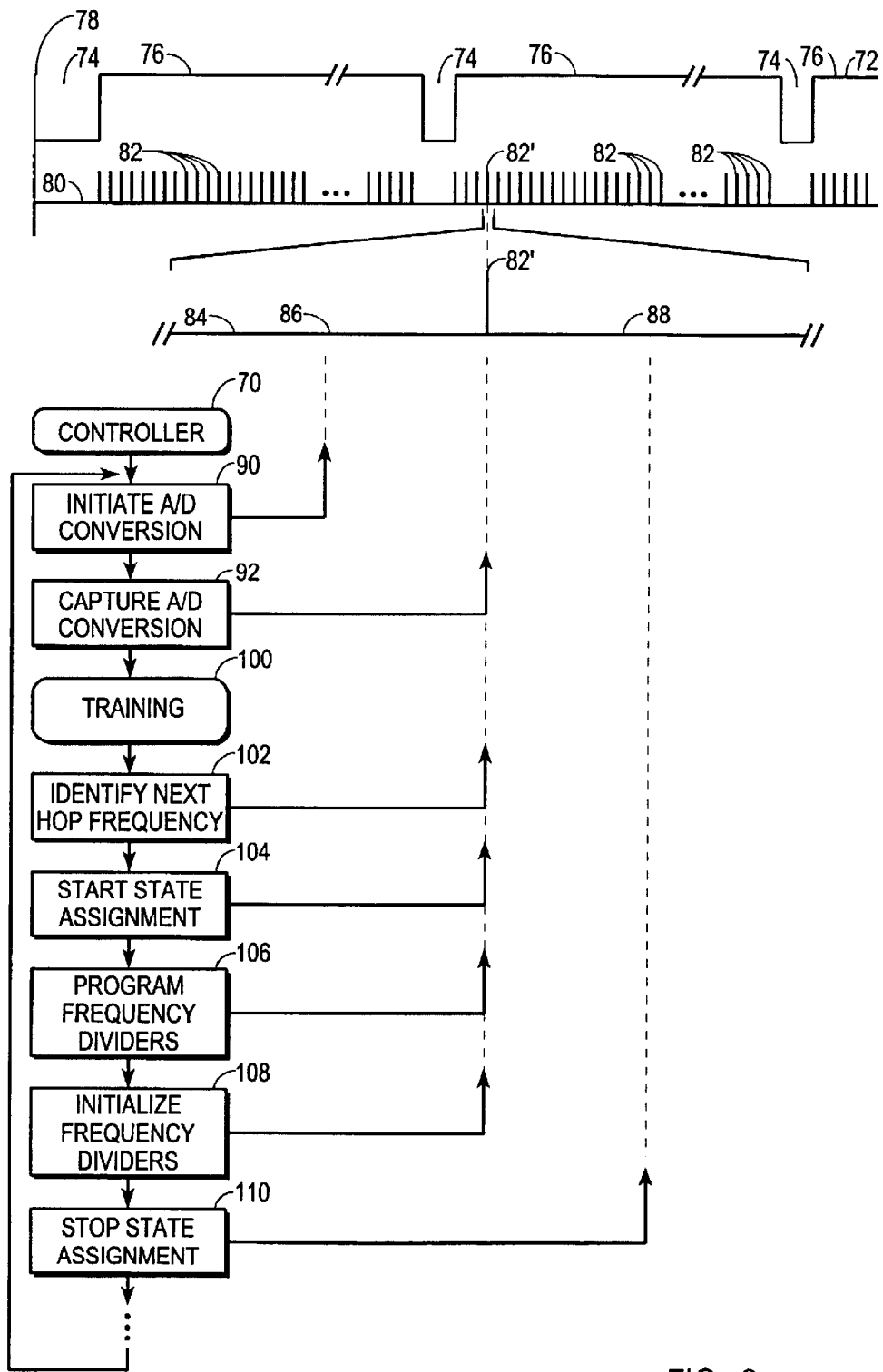
FIG. 2 shows a flow chart of a controller process carried out by the prepositioned frequency synthesizer of FIG. 1 in association with a timing diagram.

FIG. 2 shows a flow chart of a controller process 70 carried out by the prepositioned frequency synthesizer 10 of FIG. 1. FIG. 2 also includes a corresponding timing diagram depicting the relative timing of various tasks in controller process 70. The timing diagram portion of FIG. 2 depicts a timing trace 72 indicating that synthesizer 10 operates in a training phase 74 and a hopping phase 76. Training phase 74 desirably occurs when synthesizer 10 is initially energized at an instant 78 and on additional occasions while synthesizer 10 remains energized. The duration and frequency of occurrence for training phases 74 is not a relevant parameter. But in the preferred embodiment, training phases 74 occur for only brief durations at infrequent intervals and require substantially no time otherwise needed for the generation of synthesizer-output signal 38 (FIG. 1).

A trace 80 shows a multitude of hopping boundaries 82. At each hopping boundary 82, synthesizer 10 ceases generating the synthesizer-output signal 38 at an old frequency and begins the process of causing synthesizer-output signal 38 to exhibit a new frequency. In the preferred embodiment, synthesizer 10 hops, so that synthesizer-output signal 38 exhibits a different discrete frequency at numerous instants during each hopping phase 76.

A trace 84 expands upon temporal events occurring immediately before and after a single hopping boundary 82'. For the purposes of the following discussion, a before-hop period 86 is deemed to occur immediately before hopping boundary 82', and an after-hop period 88 is deemed to occur immediately after hopping boundary 82'. Controller process 70 performs a variety of tasks to manage these events. In the preferred embodiment, hopping boundaries 82 may be characterized by before-hop and after-hop periods 86 and 88, and all hopping boundaries 82 are managed in substantially the same manner by controller process 70.

Referring to FIGS. 1 and 2, process 70 includes a task 90 which occurs during before-hop period 86. Task 90 initiates A/D conversion in A/D converter 48 of filter-state-recording circuit 46. The A/D conversion is desirably commenced at an instant when synthesizer-output signal 38 has settled to a stable frequency from a previous hop and when sufficient time remains in before-hop period 86 to complete the conversion before hop boundary 82'. In the preferred embodiment, task 90 causes filter-state-recording circuit 46 to measure the state of loop filter 24 by observing the voltage stored on loop-filter capacitor 30.

Following task 90, at an instant occurring at or perhaps immediately before hop boundary 82', a task 92 captures the results of the conversion initiated above in task 90. Task 92 captures the results by recording the results in memory 50 in a write operation. As discussed above, the results will inevitably include some degree of error due to offsets, linearity imperfections, and the like.

FIG. 3 shows an exemplary table 94 maintained in controller 52 of the synthesizer 10 to define a frequency hopping plan. During a hopping phase 76 (FIG. 2), synthesizer 10 may cycle through a list of frequency ID's 96. While FIG. 3 arbitrarily illustrates frequency ID's as having values 0–127, any number of frequency ID's and labeling scheme may be adopted. A frequency ID 96 may, but need not, correspond to any particular frequency. A frequency column 98 in table 94 demonstrates that frequencies may be distributed in a random order in association with increasing frequency ID's 96. Frequency column 98 arbitrarily depicts actual frequencies exhibited by synthesizer-output signal 38 in a normalized manner, with the highest frequency having a value of 100. During any single hopping phase 76, synthesizer 10 may cycle through only a portion of list 96, the entire list 96, or make multiple passes through the entire list 96. Moreover, nothing prevents the frequency ID/frequency associations of table 94 to remain constant. Table 94 also includes associations for the numbers "M" and "N" that are programmed in frequency dividers 16 and 40 to cause synthesizer 10 to change to a new frequency.

Referring back to FIGS. 1 and 2, the results captured at task 92 in memory 50 may be written at an address in memory 50 corresponding to the frequency ID 96 (FIG. 3) of before-hop period 86.

Following task 92, a training sub-process 100 is performed. Training sub-process 100 is discussed in more detail below in connection with FIG. 4. But in the preferred embodiment, training sub-process 100 immediately recognizes that insufficient time may be available with which to conduct training during hopping phase 76 and immediately returns control to a task 102.

During task 102, controller 52 identifies the next hop frequency. This identification task may be accomplished by incrementing or decrementing the frequency ID 96 (FIG. 3) for before-hop period 86. The effects of task 102 desirably take place substantially at hop boundary 82'. The next hop frequency ID 96 now serves as a new address for memory 50 in filter-state-recording circuit 46.

A read operation of memory 50 at this new after-hop address then causes the last state of loop filter 24 recorded for the frequency of after-hop period 88 to be output from filter-state-recording circuit 46. This last state of loop filter 24 is presented through multiplexer 64 to memory 66 of compensation circuit 54, where it is altered through a table-look-up operation to compensate for error, and particularly error resulting from response differences between filter-state-recording circuit 46 and filter-state-assigning circuit 56. The table stored in memory 66 is generated by training process 100. The error-compensated output from compensation circuit 54 is then routed through multiplexer 58 and presented to an input of D/A converter 60 in filter-state-assigning circuit 56. Desirably, D/A converter 60 immediately begins its conversion process and completes the conversion process quickly to produce an error-compensated analog signal. As discussed above, this conversion process inevitably causes the error-compensated analog signal to include some error, but the compensation provided by compensation circuit 54 is configured to account for the error.

A task 104 starts the assignment of a new state to loop filter 24. Task 104 occurs after task 102, or in some other sequence that nevertheless permits the effects of task 104 to occur substantially at hop boundary 82'. Task 104 may be effected by forcing switching device 62 of filter-state-assigning circuit 56 into a closed state. When switching device 62 closes, the error-compensated analog signal produced by D/A converter 60 begins to charge or discharge loop-filter capacitor 30 of loop filter 24.

In the preferred embodiment, the output from filter-state-assigning circuit 56 when switching device 62 closes has as low impedance as practical to facilitate the rapid and accurate charging and discharging of loop-filter capacitor 30. In one embodiment, loop-filter resistor 28 has a sufficiently great resistance value to provide adequate isolation from charge pump (not shown) and/or other circuits located upstream from loop filter 24. In another embodiment, a switch (not shown) is added upstream of loop filter 24 and opened at hop boundary 82' to facilitate the rapid and accurate charging and discharging of loop-filter capacitor 30. Due to the compensation provided by compensation circuit 54, response differences between filter-state-recording circuit 46 and filter-state-assigning circuit 56 that lead to error are compensated. Thus, loop-filter capacitor 30 is accurately charged or discharged to nearly the true voltage that was attained at the previous hop when synthesizer 10 generated the same frequency.

A task 106 instantiates frequency dividers 16 and 40 with the appropriate "M" and "N" numbers that will cause synthesizer-output signal 38 to exhibit the desired frequency for after-hop period 88. Task 106 occurs after task 104, or in some other sequence that nevertheless permits the effects of task 106 to occur substantially at hop boundary 82'. The "M" and "N" numbers may be-obtained from table 94 (FIG. 3).

A task 108 initializes frequency dividers 16 and 40 to a condition where divided reference signal 18 and divided synthesizer-output signal 42 are substantially phase-matched. Task 108 occurs after task 106, or in some other sequence that nevertheless permits the effects of task 108 to occur substantially at hop boundary 82'. Task 108 may be carried out by activating phase-matching signal 68. As discussed above, frequency dividers 16 and 40 are desirably configured so that their initialization task takes place substantially immediately upon the activation of phase-matching signal 68.

Following task 108, a task 110 stops the state assignment operation begun above in task 104. Task 110 desirably takes place after hop boundary 82' at an instant in after-hop period 88 as close to hop boundary 82' as possible while nevertheless accommodating the accurate charging and discharging of loop-filter capacitor 30. Task 110 may cause switching device 62 in filter-state-assigning circuit 56 to open. If a switch is included upstream of loop filter 24, it may be closed at this instant as well.

When task 110 takes effect, PLL 26 operates in a closed loop fashion to maintain the desired frequency for the remainder of after-hop period 88. But due to the phase matching of divided reference signal 18 and divided synthesizer-output signal 42, phase lock has already been substantially achieved. In addition, due to the compensation of loop-filter states respectively recorded by and assigned by filter-state-recording and filter-state-assigning circuits 46 and 56, loop-filter capacitor 30 has been accurately charged so that variable frequency oscillator 36 is already generating substantially the desired frequency. Little additional time, if any, is needed by PLL 26 to search for the desired output frequency.

FIG. 2 depicts ellipsis following task 110 to indicate that controller process 70 may include additional tasks. However, at some point after task 110, process flow returns to task 90 to repeat controller process 70 in connection with another next hop.

FIG. 4 shows a flow chart of training sub-process 100 carried out by controller 52. Training sub-process 100 is desirably performed after completion of all tasks related to a before-hop period 86, e.g., after task 92 (FIG. 2). Ellipsis in FIG. 4 indicate that additional tasks may be included. But such additional tasks are desirably few in number and subprocess 100 eventually performs a query task 112 to determine whether sufficient time is available to perform training. In the preferred embodiment, sufficient time is available during training phases 74 (FIG. 2) which occur immediately after energization 78 (FIG. 2) and on occasion thereafter so long as synthesizer 10 remains energized. If task 112 determines that insufficient time remains, such as may result during hopping phases 76 (FIG. 2), then program control immediately returns to controller process 70 (FIG. 2).

When task 112 finds sufficient time with which to perform training, a query task 114 is performed to determine whether a new compensation transfer function is available. The compensation transfer function and the consequences of its availability are discussed in more detail below. But when a new compensation transfer function is not available, a query task 116 determines whether a cycle of test-bit combinations is now complete.

A cycle of test-bit combinations in the preferred embodiment includes all the unique bit combinations possible for the resolution provided by A/D converter 48 and D/A converter 60 (FIG. 1). Thus, if A/D and D/A converters 48 and 60, respectively, are 12-bit converters, then 4096 (i.e., $2^{12}$) unique 12-bit words are included in a cycle of test-bit combinations. If A/D and D/A converters 48 and 60 are each 16 bit converters, then 65,536 (i.e., $2^{16}$) unique 16-bit words are included in a cycle of test-bit combinations. Training sub-process 100 performs separate tests using each single test-bit combination in the cycle. Thus, task 116 determines whether all of the tests for a complete cycle have been conducted.

When task 116 determines that additional tests remain for the current cycle of test-bit combinations, a task 118 identifies the next test-bit combination for the cycle. Task 118 may increment or decrement the previous test-bit combination to identify the next test-bit combination. Following task 118, a task 120 forces filter-state-assigning circuit 56 to output a test signal resulting from the test-bit combination identified in task 118. During task 120 the test-bit combination may be presented to D/A converter 60 from controller 52 through multiplexer 58, and switching device 62 closes.

Following task 120, a task 122 records the test signal as measured at filter-state-recording circuit 46. During task 122 controller 52 may cause A/D converter 48 to make a conversion and obtain the results from the conversion from the output of A/D converter 48. Following task 122, program control loops back to task 112 to determine if sufficient time remains to conduct additional training.

Eventually, query task 116 determines that a cycle of test-bit combinations is complete. Then, a task 124 calculates a new compensation transfer function. The calculations performed in task 124 depend upon the architecture of compensation circuit 54. For the look-up-table architecture depicted in FIG. 1, task 124 calculates a table in which, for all bit combinations, the output values equal the input values offset by any differences observed between the test-bit combinations output during task 120 and the corresponding test-bit combinations recorded at task 122.

However, those skilled in the art will appreciate that compensation circuit 54 may be implemented with different architectures than depicted in FIG. 1, and that different architectures may lead to different calculations in task 124. For example, task 124 may perform a curve-fitting operation in which coefficients of an equation that describes the relationship between test-bit combinations and input/output discrepancies are determined. In such an embodiment, compensation circuit 54 may be implemented with latching, multiplying, and adding circuits that calculate the appropriate compensation to apply to the various bit combinations that will be processed in filter-state-recording and filter-state-assigning circuits 46 and 56. In another embodiment, task 124 may simply make a list of calculated differences between input and output test-bit combinations. In this embodiment, compensation circuit 54 may include a look-up-table, but additionally include an adder to add the output of the look-up-table to the recorded states provided by filter-state-recording circuit 46. These and other modifications will be understood by those skilled in the art to be included within the scope of the present invention.

When task 122 completes its calculation of the transfer function to be applied by compensation circuit 54, program control loops back to task 112 to determine if sufficient time remains to conduct additional training.

While training is ongoing, query task 114 eventually determines that a new compensation transfer function has become available. This determination should be made upon the next iteration of task 114 following completion of task 124. When a new compensation transfer function has become available, a task 126 is performed to save the new compensation transfer function in compensation circuit 54. Task 126 may involve the writing of look-up values to memory 66 using addressing applied from controller 52 through multiplexer 64. In alternate embodiments, task 126 may simply write equation coefficient values to compensation circuit 54. When task 126 finishes saving the most recently calculated transfer function in compensation circuit 54, program control loops back to task 112 to determine if sufficient time remains to conduct additional training.

In summary, an improved prepositioned frequency synthesizer and method are provided. The present invention improves upon conventional frequency synthesizer prepositioning techniques to achieve faster settling times for a given loop filter bandwidth. A compensation circuit 54 is provided to accurately preposition the state of loop filter 24 so that errors are reduced and PLL 26 need not search far to settle at a desired frequency. Frequency dividers are provided for both reference frequency divider 16 and output-signal divider 40 so that, among other reasons, both frequency dividers can be instantly set to an initial value where the signals 18 and 42 compared in phase comparator 20 are phase-matched.

Although the preferred embodiments of the invention have been illustrated and described in detail, it will be readily apparent to those skilled in the art that various modifications, additions, and/or enhancements may be made therein without departing from the spirit of the invention or from the scope of the appended claims. In one such modification, the values "M" and/or "N" may be made to dither between the desired values depicted in table 94 (FIG. 3) and values offset therefrom by one least significant bit. Desirably, such dithering follows a random or nearly random schedule. A benefit from such dithering is that the phase noise of the synthesizer-output signal will then exhibit reduced structured components.

What is claimed is:

1. A prepositioned frequency synthesizer for rapidly settling at new frequencies, said prepositioned synthesizer comprising:

a first frequency divider configured to divide a frequency of a synthesizer-output signal by a number N;

a second frequency divider configured to divide a frequency of a reference signal by a number M;

a phase comparator having inputs coupled to said first and second frequency dividers;

a loop filter coupled to said phase comparator;

a variable frequency oscillator having an input coupled to said loop filter and an output configured to provide said synthesizer-output signal;

a filter-state-recording circuit coupled to said loop filter and configured to record states exhibited by said loop filter;

a filter-state-assigning circuit coupled to said loop filter and configured to assign states to said loop filter; and a controller coupled to said first and second dividers and to said filter-state-assigning circuit, said controller being configured to set said first and second frequency dividers to initial conditions and to assign a state to said loop filter when changing to a new frequency.

2. A prepositioned synthesizer as claimed in claim 1 additionally comprising a compensation circuit coupled to said filter-state-recording circuit and to said filter-state-assigning circuit, said compensation circuit being configured to compensate for response differences between said filter-state-recording circuit and said filter-state-assigning circuit.

3. A prepositioned synthesizer as claimed in claim 2 wherein said compensation circuit is configured to adapt to individual characteristics of said filter-state-recording circuit and said filter-state-assigning circuit.

4. A prepositioned synthesizer as claimed in claim 2 wherein said controller couples to said compensation circuit and is configured to train said compensation circuit to accommodate individual characteristics of said filter-state-recording circuit and said filter-state-assigning circuit.

5. A prepositioned synthesizer as claimed in claim 4 wherein said controller is further configured to train said compensation circuit when said prepositioned synthesizer is initially energized and on additional occasions while said prepositioned synthesizer remains energized.

6. A prepositioned synthesizer as claimed in claim 1 wherein:

said filter-state-recording circuit comprises an analog-to-digital conversion circuit coupled to a data input of a read/write memory; and said filter-state-assigning circuit comprises a digital-to-analog converter coupled to a switch.

7. A prepositioned synthesizer as claimed in claim 1 wherein:

said synthesizer-output signal exhibits a plurality of discrete frequencies;

said controller couples to said filter-state-recording circuit;

said controller is configured so that said filter-state-recording circuit records a state of said loop filter when said synthesizer-output signal exhibits one of said plurality of discrete frequencies; and said controller is further configured so that, when changing said synthesizer-output signal to a selected one of said plurality of discrete frequencies, said filter-state-assigning circuit assigns substantially the same state to said loop filter that was recorded in said filter-state-recording circuit during a previous period when said synthesizer-output signal exhibited said selected one of said plurality of discrete frequencies.

8. A prepositioned synthesizer as claimed in claim 1 wherein:

said states exhibited by said loop filter and recorded in said filter-state-recording circuit are characterized by voltages stored on a loop filter capacitor; and said variable frequency oscillator is a voltage controlled oscillator.

9. A prepositioned synthesizer as claimed in claim 1 wherein said controller is further configured to instantiate said numbers N and M when changing to said new frequency.

10. A prepositioned frequency synthesizer for rapidly settling at new frequencies, said prepositioned synthesizer comprising:

a frequency divider configured to divide a frequency of a synthesizer-output signal by a number N;

a reference frequency source;

a phase comparator having a first input coupled to said frequency divider and a second input coupled to said reference frequency source;

a loop filter coupled to said phase comparator;

a variable frequency oscillator having an input coupled to said loop filter and an output configured to provide said synthesizer-output signal;

a filter-state-recording circuit coupled to said loop filter and configured to record states exhibited by said loop filter;

a filter-state-assigning circuit coupled to said loop filter and configured to assign states to said loop filter; and a compensation circuit coupled to said filter-state-recording circuit and to said filter-state-assigning circuit, said compensation circuit being configured to compensate for response differences between said filter-state-recording circuit and said filter-state-assigning circuit.

11. A prepositioned synthesizer as claimed in claim 10 wherein said compensation circuit is configured to adapt to individual characteristics of said filter-state-recording circuit and said filter-state-assigning circuit.

12. A prepositioned synthesizer as claimed in claim 10 wherein:

said prepositioned-synthesizer additionally comprises a controller coupled to said compensation circuit, said filter-state-recording circuit, and said filter-state-assigning circuit; and said controller is configured to train said compensation circuit to accommodate individual characteristics of said filter-state-recording circuit and said filter-state-assigning circuit.

13. A prepositioned synthesizer as claimed in claim 12 wherein said controller is further configured to train said compensation circuit when said prepositioned synthesizer is initially energized and on additional occasions while said prepositioned synthesizer remains energized.

14. A prepositioned synthesizer as claimed in claim 10 wherein:

said filter-state-recording circuit comprises an analog-to-digital conversion circuit coupled to a data input of a read/write memory; and said filter-state-assigning circuit comprises a digital-to-analog converter coupled to a switch.

15. A prepositioned synthesizer as claimed in claim 10 wherein:

said prepositioned synthesizer additionally comprises a controller coupled to said compensation circuit, said filter-state-recording circuit, and said filter-state-assigning circuit;

said synthesizer-output signal exhibits a plurality of discrete frequencies;

said controller is configured so that said filter-state-recording circuit records a state of said loop filter when said synthesizer-output signal exhibits one of said plurality of discrete frequencies; and said controller is further configured so that, when changing said synthesizer-output signal to a selected one of said plurality of discrete frequencies, said filter-state-assigning circuit assigns substantially the same state to said loop filter that was recorded in said filter-state-recording circuit during a previous period when said synthesizer-output signal exhibited said selected one of said plurality of discrete frequencies.

16. A prepositioned synthesizer as claimed in claim 10 wherein:

said states exhibited by said loop filter and recorded in said filter-state-recording circuit are characterized by voltages stored on a loop filter capacitor; and said variable frequency oscillator is a voltage controlled oscillator.

17. A prepositioned synthesizer as claimed in claim 10 wherein:

said prepositioned synthesizer additionally comprises a controller coupled to said frequency divider; and said controller is configured to set said frequency divider to an initial condition when changing said synthesizer so that said synthesizer-output signal will exhibit a new frequency.

18. A prepositioned synthesizer as claimed in claim 17 wherein:

said frequency divider is a first frequency divider;

said prepositioned synthesizer additionally comprises a second frequency divider coupled between said reference frequency source and said phase comparator and coupled to said controller, said second frequency divider being configured to divide a reference frequency by a number M; and said controller is further configured to set said second frequency divider to an initial condition when changing said synthesizer so that said synthesizer-output signal will exhibit said new frequency.

19. A prepositioned synthesizer as claimed in claim 18 wherein said controller is further configured to instantiate said numbers N and M when changing to said new frequency.

20. A method of operating a prepositioned frequency synthesizer to rapidly settle at a selected frequency, said method comprising:

producing measured states by measuring actual states of a loop filter as said synthesizer outputs a plurality of discrete synthesizer-output frequencies, wherein said selected frequency is one of said plurality of discrete synthesizer-output frequencies;

compensating said one of said measured states which corresponds to said selected frequency to generate an assigned state;

assigning said assigned state to said loop filter, said assigned state being configured so that said loop filter exhibits substantially said actual state for said selected frequency after said assigning activity;

initializing a synthesizer-output signal frequency divider to an initial state;

initializing a reference signal frequency divider to an initial state; and programming said frequency dividers to divide by values that cause said synthesizer to generate said selected frequency.

21. A method as claimed in claim 20 additionally comprising training a compensation circuit from time to time to perform said compensating activity.

* * * * *